United States Patent [19]
Nagai et al.

[11] Patent Number: 5,690,733
[45] Date of Patent: Nov. 25, 1997

[54] METHOD FOR RECHARGING OF SILICON GRANULES IN A CZOCHRALSKI SINGLE CRYSTAL GROWING OPERATION

[75] Inventors: Naoki Nagai; Michiaki Oda; Seiichiro Ohtsuka; Isamu Harada, all of Gunma-ken, Japan

[73] Assignee: Shin-Etsu Handotai Co., Ltd., Tokyo, Japan

[21] Appl. No.: 552,494

[22] Filed: Nov. 9, 1995

[30] Foreign Application Priority Data

Nov. 21, 1994 [JP] Japan .................................. 6-286246

[51] Int. Cl.⁶ .................................................. C30B 15/04
[52] U.S. Cl. .................................. 117/18; 117/33; 117/34
[58] Field of Search .................................. 117/1, 13, 18, 117/33, 34, 912

[56] References Cited

U.S. PATENT DOCUMENTS

| | | | |
|---|---|---|---|
| 4,468,279 | 8/1984 | Itzkan | 117/34 |
| 5,037,503 | 8/1991 | Kajimoto et al. | 117/33 |
| 5,080,873 | 1/1992 | Ono et al. | 117/912 |
| 5,462,010 | 10/1995 | Takano et al. | 117/33 |
| 5,492,078 | 2/1996 | Alterkrüger et al. | 117/19 |
| 5,492,079 | 2/1996 | Geissler et al. | 117/33 |

FOREIGN PATENT DOCUMENTS

| | | |
|---|---|---|
| 0 170 856 | 2/1986 | European Pat. Off. . |
| 0 315 156 | 5/1989 | European Pat. Off. . |
| 0 537 988 | 4/1993 | European Pat. Off. . |

*Primary Examiner*—Felisa Garrett
*Attorney, Agent, or Firm*—Wenderoth, Lind & Ponack

[57] ABSTRACT

A recharger system including a feeder and a feed conduit recharge polycrystalline silicon granules into a crucible after a run or operation of growing a single crystal silicon rod by the Czochralski method, thereby to prepare for a next run of crystal growing. The amount of holdup or backed-up supply of the silicon granules in the feed conduit is detected by a sensor provided on the feed conduit. A smooth and high-rate feed of the silicon granules is ensured by controlling the feed rate of the silicon granules from the feeder to the feed conduit and/or a descending velocity of the crucible by signals generated in the sensor as a function of the amount of the holdup or backed-up supply in the feed conduit.

7 Claims, 2 Drawing Sheets

METHOD FOR RECHARGING OF SILICON GRANULES IN A CZOCHRALSKI SINGLE CRYSTAL GROWING OPERATION

BACKGROUND OF THE INVENTION

The present invention relates to a method for recharging of polycrystalline silicon granules into a crucible in a Czochralski single crystal growing process, hereinafter referred to as the CZ process, especially of semiconductor silicon.

As is well known, most semiconductor-grade silicon single crystals are manufactured by the so-called CZ process in which a single crystal rod of silicon is grown from a melt of silicon, contained in a fused silica glass crucible, on the lower end of a seed crystal which is pulled up at a controlled rate. This CZ process is a typical batch-wise process and it is traditional that, when most of the silicon melt has been converted into the single crystal rod, the process is discontinued and a next run is started anew. Such a process is of course not quite satisfactory with respect to productivity, even without consideration of the problem that the expensive fused silica glass crucible cracks when it is cooled down.

In this regard, it has been practiced recently that, when a single crystal rod of silicon has been grown and the amount of the silicon melt remaining in the crucible has been decreased below a certain level, the crucible is recharged with polycrystalline silicon granules through a feed conduit installed above the crucible without cooling the crucible. Such recharging is in such an amount as to enable starting of another run of single crystal growing. Further, a continuous recharging method is known in which supply of silicon granules is conducted continuously, while a silicon single crystal is still being grown, at a controlled rate of, for example, 0.3 to 1.0 g/second to compensate for the decrease in the mount of the melt in the crucible. This method provides a possibility of greatly reducing the manufacturing costs of silicon single crystals.

The above mentioned continuous recharging method has several problems. For example, falling of the silicon granules onto the surface of the silicon melt in the crucible sometimes causes splashing of the melt or vibration of the melt surface. This greatly disturbs the single crystal growing process in that the silicon single crystal as grown, if it could even be obtained, would suffer from the occurrence of so many dislocations or imperfections as to be contrary to the object of cost reduction. This problem due to disturbance of the melt surface by the falling silicon granules can of course be avoided by using a double-walled crucible in which the melt surface to which the silicon granules fall is isolated from the melt surface for the single crystal growing. Such method, however, is not practicable due to the expense of such a crucible of special structure.

Semiconductor Silicon Crystal Technology by F. Shimura, pages 178-179 (1989) teaches a multiple CZ growth method for reduction of the manufacturing costs of semiconductor silicon single crystals by recharging of silicon granules in the conventional batch-wise CZ process. In this method, a single crystal rod after completion of growth is removed from above the crucible. Polycrystalline silicon in the form of a rod is introduced, without decreasing the temperature, into the silicon melt remaining in the crucible and is melted therein before start of another run of the CZ process. Thus, a fused silica glass crucible, which otherwise can be used only for a single run of the CZ process due to cracking caused by a temperature decrease, can be re-used repeatedly for several runs. This process greatly decreases the manufacturing costs by improved productivity and cost saving of the expensive fused silica glass crucibles.

An alternative method of recharging is disclosed in Japanese Patent Kokai 62-260791 according to which the temperature of the melt remaining in the crucible after completion of a run of the CZ process for growing of a single crystal rod is slightly decreased so as to form a solidified crust on the melt surface. Silicon granules are introduced onto the crust through a feed conduit opening above the crucible.

In the above described recharging methods in general, it is a matter of course that the time taken for recharging of polycrystalline silicon desirably should be as short as possible in order to accomplish maximum improvement in productivity of the CZ process. Thus, the feed rate of the polycrystalline silicon for recharge must be as high as possible, provided that no damage is caused thereby in the fused silica glass crucible. In this regard, the polycrystalline silicon used for recharging is preferably in the form of a rod or block so as to enable the polycrystalline silicon to be introduced at one time or within a short period of time.

In the multiple CZ growth method taught by F. Shimura mentioned above, the polycrystalline silicon for recharge is in the form of a rod or block which is hung on the lower end of a pull-up shaft or wire and is introduced into the crucible by lowering the shaft or wire. It is natural in this case that the polycrystalline silicon charge can be performed only after complete removal of the already grown-up single crystal from above the crucible and can never be performed concurrently with the removal of the single crystal rod. Thus, the contribution of such method to improvement in productivity is limited.

In contrast thereto, the method taught in Japanese Patent Kokai 62-260891 can be performed concurrently with removal of the grown-up silicon single crystal rod so as to accomplish considerable improvement in productivity. This method, however, has some disadvantages. For example, the recharging of silicon granules can be performed only after crust formation on the surface of the silicon melt remaining in the crucible. Thus, a length of time is unavoidably required for cooling of the melt in the crucible. Further, formation of a crust on the surface of the melt causes mechanical damage at the inner surface of the crucible coming into contact with the crust. Thus, the desired advantage of cost saving for the expensive fused silica glass crucibles cannot be fully obtained.

The above mentioned problems relative to the recharging of silicon granules could be solved by improvement in the method of feeding thereof into the crucible. When the feeder system for recharge is not provided with a mechanism for control of the feed rate of silicon granules, it is frequently the case that splashing of the silicon melt or bouncing of the granules onto the surface of the melt is caused by falling of the silicon granules. This problem of course can be at least partly solved by the use of a tapered feed conduit having a narrowed opening above the melt surface. The use of such a tapered feed conduit naturally has another problem in that the smooth falling of the silicon granules is more or less disturbed, so that the feed rate of the granules cannot always be high enough and can be controlled only with difficulty.

SUMMARY OF THE INVENTION

An object of the present invention accordingly is to provide an improvement in the method for recharging of polycrystalline silicon granules into the crucible for the CZ process, by which the silicon granules can be introduced directly and smoothly at an adequately controlled rate to complete recharging within a minimum length of time so that productivity of the CZ process can be greatly improved.

Thus, the present invention provides an improvement, in a method of Czochralski single crystal growing of silicon, of recharging of granules of polycrystalline silicon supplied by a feeder means into a feed conduit and falling through a lower open end of the feed conduit onto the surface of a melt of silicon contained in a crucible. The crucible is provided with means for ascending and descending thereof. A gap or space is maintained between the lower open end of the feed conduit and the surface of the melt. A holdup or backed-up supply of the granules of silicon held inside of the feed conduit is controlled in such a way that, preferably, the space between the lower open end of the feed conduit and the surface of the melt is filled by a heap of the silicon granules.

The holdup or backed-up supply of the silicon granules in the feed conduit can be controlled by adjusting the feed rate of the granules from the feeder to the feed conduit or by adjusting the descending velocity of the crucible. The adjustment of the feed rate of the silicon granules or the descending velocity of the crucible can be effected by means of signals generated by a sensor means pivoted on the feed conduit to detect the level of the holdup or backed-up supply of the granules in the feed conduit.

An apparatus by which the above described improved method of the invention can he accomplished in an apparatus used in the Czochralski single crystal growing of silicon, for recharging of granules of polycrystalline silicon includes a feeder means to feed granules into a feed conduit. The granules fall through the feed conduit onto the surface of a melt of silicon contained in a crucible provided with a means for ascending and descending the crucible. A gap or space is maintained between the lower end of the feed conduit and the surface of the melt. The feed conduit is provided with a sensor means to generate signals corresponding to the level of a holdup or hacked-up supply of the silicon granules in the feed conduit. The signals are used to adjust the feed rate of the silicon granules from the feeder to the feed conduit or the descending velocity of the crucible.

DETAILED DESCRIPTION OF THE PREFERRED EMBODIMENTS

In the following, the method according to the invention is described in detail by making reference to the accompanying drawings.

Figure 1:
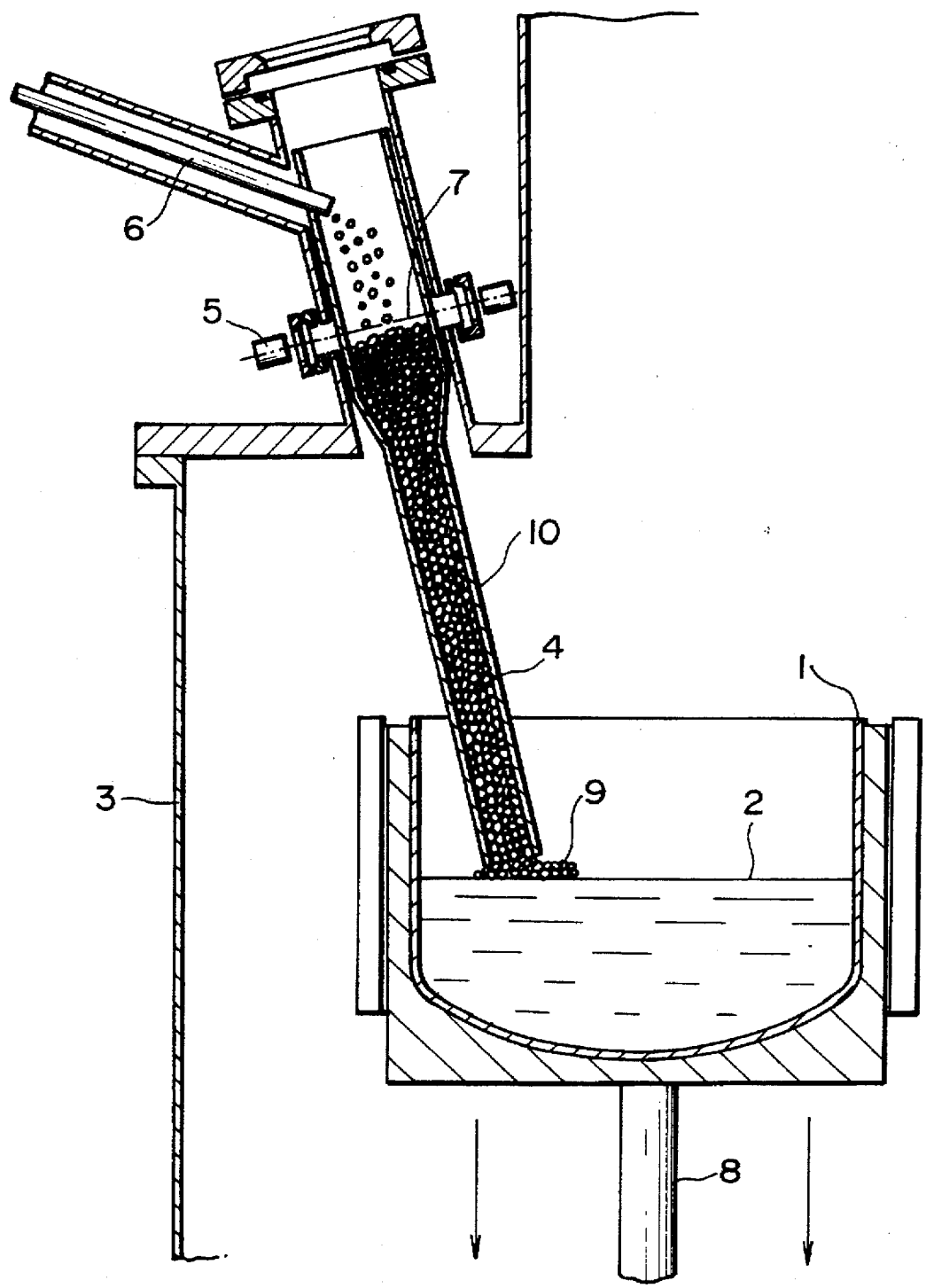
FIG. 1 is a schematic vertical cross sectional view of a CZ single crystal growing apparatus provided with a feeder system for recharging of silicon granules according to the invention.

FIG. 1 is a schematic vertical cross sectional view of a CZ single crystal growing apparatus provided with a feeder system for feeding of silicon granules according to the invention and which is shown during a step of recharging after removal of a grown single crystal rod of silicon prepared in a preceding run or operation.

As is conventional, a fused silica glass crucible 1 containing a melt of silicon 2 is supported on a rotatable shaft 8 and enclosed inside of a furnace body 3 of the single crystal growing apparatus by the CZ process. It is essential in the apparatus according to the invention that the height of the crucible 1 is adjustable by ascending or descending the shaft 8. A feeder system for feeding silicon granules is supported by furnace body 3 and includes a feeder 6 and a feed conduit 10. A lower end of the feed conduit 10 opens near to the surface of the silicon melt 2. Granules of silicon 4 supplied at a controlled rate into the feed conduit 10 from the feeder 6 are introduced into the melt of silicon 2 in the crucible 1 and melted therein, thus increasing the volume of the silicon melt 2 and thereby recharging melt 2 in preparation for the next run. The feed conduit 10 is provided with a sensor means 5 which serves to detect the level or height of a holdup or backed-up supply of the silicon granules 4 in the feed conduit 10.

The feed conduit 10 is made from a refractory material such as fused silica glass and can be in the form of a straight pipe, although it can be in the form of a tapered pipe having a downwardly decreasing diameter. The dimensions of the feed conduit 10 should be selected by taking into consideration various factors including the desired feed rate of the silicon granules 4 into the silicon melt 2, particle size of the silicon granules 4, and so on. It is usual that the lower open end of the feed conduit 10 has an inner diameter in a range from 10 to 50 mm.

The silicon granules 4 supplied from the feeder 6 are held within the feed conduit 10 at a height which is monitored by the sensor means 5 in order to ensure smooth falling or supply of granules 4 to the silicon melt 2. The principle of operation of the sensor means 5 is not particularly limiting, and sensor means 5 may include, typically, an optical level gauge which detects the uppermost level 7 of the granule backed-up supply. When the uppermost level 7 of the granule backed-up supply 4 reaches the level defined by the sensor means 5 and is detected by the sensor means 5, signals generated in the sensor means 5 are supplied to the feeder 6 so as to decrease the feed rate of the silicon granules therefrom, so that the uppermost level 7 of the granule supply is always maintained not to exceed a predetermined height. When a stationary state is established in the level of the backed-up supply of the silicon granules 4 within the feed conduit 10 in the above described manner, very smooth introduction of the granules 4 into the silicon melt 2 is ensured even at a relatively high feed rate of, for example, 50 to 70 g per second, assuming that the silicon granules have a diameter of a few millimeters. No difficulties are encountered in the feed conduit 10 due to weld-agglomeration of the granules 4 since the granules 4 are stationarily under downward movement.

The position at which the sensor means 5 is mounted on the feed conduit 10 is not particularly limitative although, in FIG. 1, it is usually just below the feeder 6. It is of course possible that the level of silicon granules 4 in the feed conduit 10 can be controlled by adjusting the position of the sensor means 5 along the feed conduit 10. When the height is increased, the falling rate of the silicon granules 4 is decreased due to an increase in frictional resistance between the inner walls of the feed conduit 10 and the silicon granules 4, or vice versa.

Figure 2:
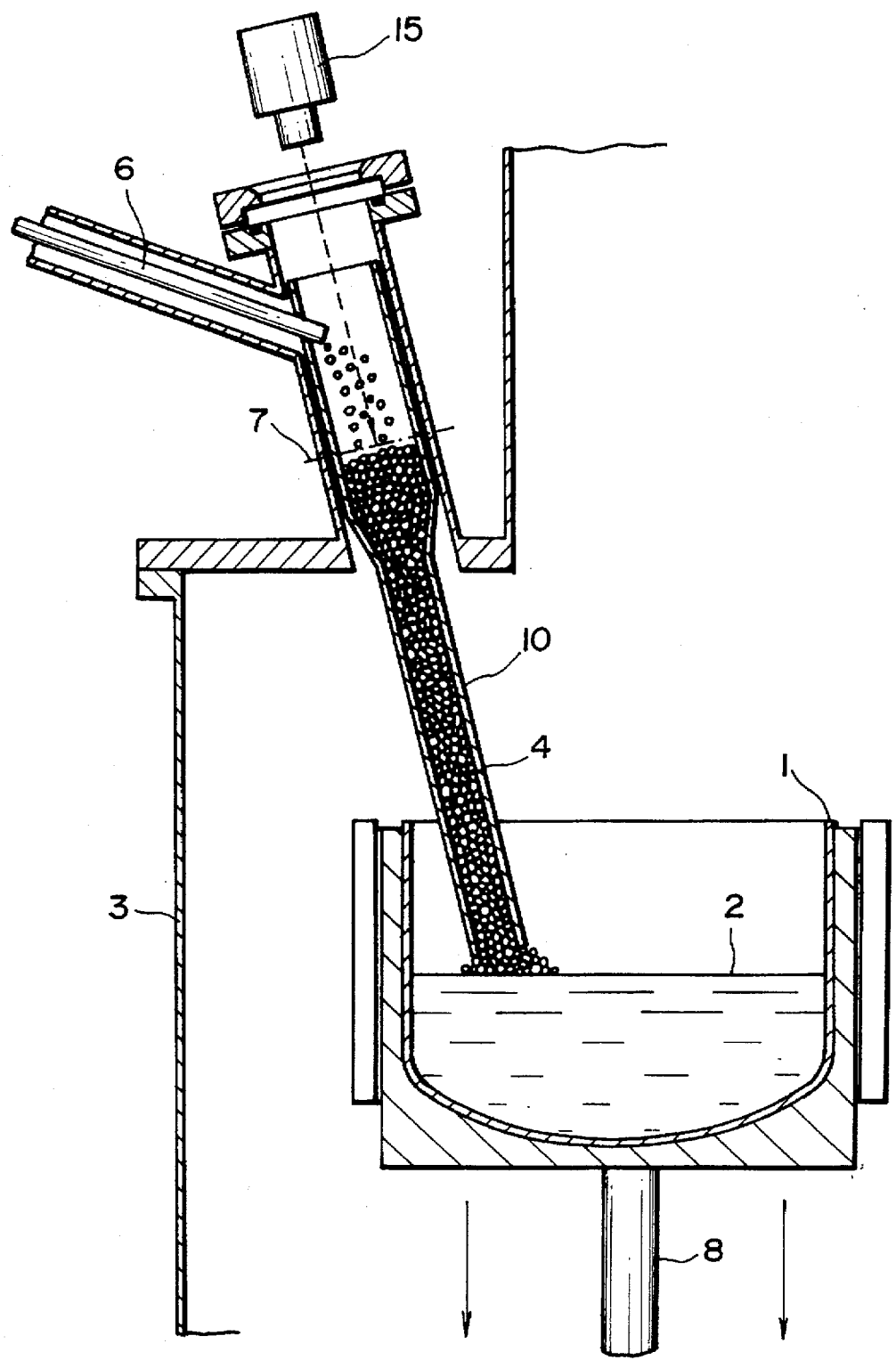
FIG. 2 is a schematic vertical cross sectional view of a CZ single crystal growing apparatus provided with another embodiment of the feeder system for recharging of silicon granules according to the invention.

Particularly suitable sensor means 5 include optical pyrometers, image sensors and the like. FIG. 2 illustrates an alternative type of the sensor means which is a CCD camera 15 mounted above the feed conduit 10.

The signal generated in the sensor means 5 or 15 indicative of the height or level 7 of the granule supply 4 in the feed conduit 10 is sent to the feeder 6 and serves to control the feed rate of the silicon granules therefrom to the feed conduit 10 so that the amount of the backed-up supply of granules in feed conduit 10 can be controlled and maintained always at an appropriate level.

The feeder 6 serves to control the feed rate of the silicon granules discharged out of a granule holder (not shown) into the feed conduit 10. Though not particularly limitative, the feeder 6 can be a vibration feeder which works under varied intensity of vibration to control the feed rate of granules. It is of course possible that other types of feeders can be used, including those having an adjustable valve which is closed or opened by the signals from the sensor means 5.

As is described above, the recharging apparatus of the invention serves to feed the silicon granules to a melt of silicon in a crucible at a controlled rate so as to maintain the backed-up supply or holdup of the silicon granules not to exceed an appropriate level. While the silicon granules falling onto the surface of the melt are melted thereby, to thus increase the volume of the silicon melt in the crucible, the feed rate of the silicon granules is controlled to be somewhat larger than the velocity at which the silicon granules on the melt surface are melted, so that as a consequence the silicon granules before melting are accumulated below and around the lower end of the feed conduit to form a heap which naturally disturbs smooth feeding of further silicon granules onto the melt surface. This difficulty can be overcome by gradually lowering the crucible by descending or lowering the shaft 8 so that feeding of the silicon granules can be continued without being distributed by the heap of granules below and around the lower open end of the feed conduit. This descending movement of the crucible also can be controlled by the signals coming from the sensor means that detects the level of the backed-up supply or holdup of the silicon granules in the feed conduit and that maintains an appropriate amount of such supply.

An example of starting a recharging process after a run of crystal growing now will be described. A fused silica glass crucible of 18 inch diameter was used to obtain a single crystal silicon rod which was removed from above the crucible. A gap or distance between the lower open end of the feed conduit 10, which has a length of 110 cm, inner diameter of 36 mm and outer diameter of 40 mm, and the surface of the melt remaining in the crucible, which should be as small as possible in order to ensure rapid establishment of the granule backed-up supply within the feed conduit 10, is set at 5 to 10 mm in consideration of various factors including the form and diameter of the lower open end of the feed conduit, size of the crucible, and so on. When this distance is too small, there is a risk that the lower end of the feed conduit is eventually contacted with the melt of silicon, and when this distance is too large, the silicon granules falling out of the lower open end of the feed conduit unavoidably cause splashing of the silicon melt, and a disadvantageously long period of time is taken before establishment of the granule backed-up supply within the feed conduit. The backed-up supply of the silicon granules is established by the initial feed into feed conduit 10 and, when the height of the backed-up supply reaches a certain predetermined level, the sensor means generates a signal which serves to control the feed rate of the silicon granules by the feeder 6 so as to maintain the height of the backed-up supply to not exceed the appropriate level.

While maintaining the height of the backed-up supply of the silicon granules in the feed conduit not to exceed an appropriate level and maintaining the temperature of the silicon melt in the crucible at a temperature suitable for melting of the silicon granules, the crucible is gently rotated at a low velocity of 2 revolutions/minute. Thus, the silicon granules falling onto the melt surface form a heap in contact with the lower end of the feed conduit and further grow in an annular form by the accumulation of the additional silicon granules discharged out of the feed conduit because the feed rate of the silicon granules is somewhat greater than the velocity of melting of the granules into the melt of silicon in the crucible.

As the silicon granules heaped up on the melt surface to such a height that further feed of the granules out of the feed conduit no longer can be continued, the top level of the granule backed-up supply in the feed conduit is detected by the sensor means, thus generating a signal by which the downward movement of the crucible is started, thereby to increase the gap or distance between the lower open end of the feed conduit and the melt surface so as to enable further feeding of the silicon granules out of the feed conduit. The descending velocity of the crucible in this case is selected to be in a range from 5 to 30 m/minute, although the velocity should be selected adequately depending on the condition of the granule heaps and other factors such as the dimensions of the feed conduit and crucible. By conducting the above described procedure appropriately, the velocity of recharging can be as great as 50 g/second or even greater, so that the time taken for recharging before starting of the next run of single crystal growing can be greatly decreased.

What is claimed is:

1. In a batch-wise process of Czochralski single crystal growing from a melt of silicon in a crucible, wherein a single crystal rod of silicon is grown and withdrawn from said crucible in a growing operation, after which growing is discontinued, and then said crucible is recharged with granules of polycrystalline silicon during a recharging operation in preparation for a subsequent growing operation, the improvement wherein said recharging operation comprises:

supplying said granules at a feed rate of at least about 50 g/second from a feeder into a feed conduit having a lower open end spaced by a gap above said melt in said crucible, and allowing said granules to fall through said feed conduit onto said melt and to form a backed-up supply of granules within said feed conduit; and controlling an amount of said backed-up supply of granules within said feed conduit.

2. The improvement claimed in claim 1, wherein said amount of said backed-up supply granules in said feed conduit is controlled by adjusting said feed rate of said granules from said feeder to said feed conduit or by adjusting a velocity of lowering of said crucible.

3. The improvement claimed in claim 2, wherein said adjusting said feed rate of said granules from said feeder to said feed conduit or said adjusting said velocity of lowering of said crucible is effected by means of signals generated in a sensor means provided on said feed conduit to detect said amount of backed-up supply of silicon granules in said feed conduit.

4. In a batch-wise process of Czochralski single crystal growing from a melt of silicon in a crucible, wherein a single crystal rod of silicon is grown and withdrawn from said crucible in a growing operation, after which growing is discontinued, and then said crucible is recharged with granules of polycrystalline silicon during a recharging operation in preparation for a subsequent growing operation, the improvement wherein said recharging operation comprises:

supplying said granules from a feeder into a feed conduit having a lower open end spaced by a gap above said melt in said crucible, and allowing said granules to fall through said feed conduit onto said melt such that said gap is filled with granules and to form a backed-up supply of granules within said feed conduit; and controlling an amount of said backed-up supply of granules within said feed conduit.

5. The improvement claimed in claim 4, wherein said amount of said backed-up supply granules in said feed conduit is controlled by adjusting feed rate of said granules from said feeder to said feed conduit or by adjusting a velocity of lowering of said crucible.

6. The improvement claimed in claim 5, wherein said adjusting said feed rate of said granules from said feeder to said feed conduit or said adjusting said velocity of lowering of said crucible is effected by means of signals generated in a sensor means provided on said feed conduit to detect said amount of backed-up supply of silicon granules in said feed conduit.

7. The improvement claimed in clam 4, wherein a feed rate of said granules is at least about 50 g/second.

* * * * *